US011622475B2

(12) United States Patent
Jin et al.

(10) Patent No.: US 11,622,475 B2
(45) Date of Patent: *Apr. 4, 2023

(54) POWER MODULE HAVING METALLIC HEAT-DISSIPATION SUBSTRATE

(71) Applicant: DELTA ELECTRONICS, INC., Taoyuan (TW)

(72) Inventors: Da Jin, Taoyuan (TW); Shaojun Chen, Taoyuan (TW); Yahong Xiong, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 29 days.

This patent is subject to a terminal disclaimer.

(21) Appl. No.: 17/365,758

(22) Filed: Jul. 1, 2021

(65) Prior Publication Data

US 2021/0329809 A1    Oct. 21, 2021

Related U.S. Application Data

(63) Continuation of application No. 16/589,874, filed on Oct. 1, 2019, now Pat. No. 11,122,714.

(30) Foreign Application Priority Data

Oct. 17, 2018   (CN) .......................... 201811206831.9

(51) Int. Cl.
*H05K 7/20* (2006.01)
*H05K 1/18* (2006.01)
*H05K 1/16* (2006.01)

(52) U.S. Cl.
CPC ............... *H05K 7/209* (2013.01); *H05K 1/18* (2013.01); *H05K 1/165* (2013.01);
(Continued)

(58) Field of Classification Search
CPC .......... H05K 7/209; H05K 1/18; H05K 1/165; H05K 2201/066; H05K 2201/10053;
(Continued)

(56) References Cited

U.S. PATENT DOCUMENTS 5,323,292 A    6/1994  Brzezinski
5,430,611 A *  7/1995  Patel ..................... H01L 23/467
                                              257/E23.09
(Continued)

FOREIGN PATENT DOCUMENTS

CN    1441613 A    9/2003
CN    2831714 Y   10/2006
(Continued)

*Primary Examiner* — Anatoly Vortman
(74) *Attorney, Agent, or Firm* — Kirton McConkie; Evan R. Witt

(57) ABSTRACT

A power module includes a power source module and a metallic heat-dissipation substrate. The power source module has an input pin and an output pin soldered on and electrically connected with a system board and includes a printed circuit board. The printed circuit board has a first surface and a second surface. At least a heat-generating component is disposed on the second surface. The metallic heat-dissipation substrate has a first surface and a second surface opposite to each other. The first surface has at least a fixing position and at least a heat-dissipating position. The fixing position is directly or indirectly connected with the second surface. A gap accumulated by tolerances is existed between the heat-dissipating position and the heat-generating component. A gap-filling material is filled into the gap. The second surface and the system board are soldered with each other. Therefore, the heat-dissipation efficiency is enhanced.

16 Claims, 5 Drawing Sheets

(52) U.S. Cl.
CPC .............. *H05K 2201/066* (2013.01); *H05K 2201/10053* (2013.01); *H05K 2201/1056* (2013.01); *H05K 2201/10318* (2013.01); *H05K 2201/10545* (2013.01)

(58) Field of Classification Search
CPC .......... H05K 2201/10318; H05K 2201/10545; H05K 2201/1056
USPC ........................................................ 361/715
See application file for complete search history.

(56) References Cited

U.S. PATENT DOCUMENTS

| | | | |
|---|---|---|---|
| 6,256,201 B1 | 7/2001 | Ikeda et al. | |
| 6,366,462 B1 * | 4/2002 | Chu ..................... | H01L 23/427 257/714 |
| 6,665,187 B1 * | 12/2003 | Alcoe .................. | H01L 23/427 257/E23.101 |
| 6,807,061 B1 | 10/2004 | Harris | |
| 6,870,738 B2 | 3/2005 | Goebl | |
| 6,873,529 B2 | 3/2005 | Ikuta et al. | |
| 6,947,293 B2 | 9/2005 | DeBene, II et al. | |
| 6,972,958 B2 | 12/2005 | Mayer | |
| 7,031,162 B2 | 4/2006 | Arvelo et al. | |
| 7,221,571 B2 * | 5/2007 | Kubo .................... | H01L 23/42 257/E23.09 |
| 7,254,032 B1 | 8/2007 | Xue et al. | |
| 7,468,886 B2 | 12/2008 | Coico et al. | |
| 7,518,233 B1 * | 4/2009 | Takahashi ........... | H01L 23/4006 257/796 |
| 7,859,377 B2 | 12/2010 | Kawarai | |
| 7,952,879 B1 | 5/2011 | Vinciarelli et al. | |
| 7,973,635 B2 | 7/2011 | Baarman et al. | |
| 8,014,152 B2 | 9/2011 | Nishiuma et al. | |
| 8,238,103 B2 | 8/2012 | Urai | |
| 11,071,195 B1 * | 7/2021 | Tong ................... | H01L 23/4006 |
| 2004/0027802 A1 | 2/2004 | Duerbaum et al. | |
| 2006/0044762 A1 | 3/2006 | Kikuchi et al. | |
| 2013/0050954 A1 | 2/2013 | Albrecht, III et al. | |
| 2013/0258599 A1 | 10/2013 | Danello et al. | |
| 2014/0355218 A1 | 12/2014 | Vinciarelli et al. | |
| 2014/0369006 A1 | 12/2014 | Williams | |
| 2015/0108630 A1 | 4/2015 | Izuno et al. | |
| 2019/0114526 A1 | 4/2019 | Finn et al. | |
| 2019/0115282 A1 * | 4/2019 | Wu ..................... | H01L 23/4006 |
| 2019/0306985 A1 | 10/2019 | Ferguson et al. | |
| 2020/0127578 A1 | 4/2020 | Jin et al. | |

FOREIGN PATENT DOCUMENTS

| | | |
|---|---|---|
| CN | 101810062 A | 8/2010 |
| CN | 101946395 A | 1/2011 |
| CN | 202103943 U | 1/2012 |
| CN | 102892277 A | 1/2013 |
| CN | 107112735 A | 8/2017 |

\* cited by examiner

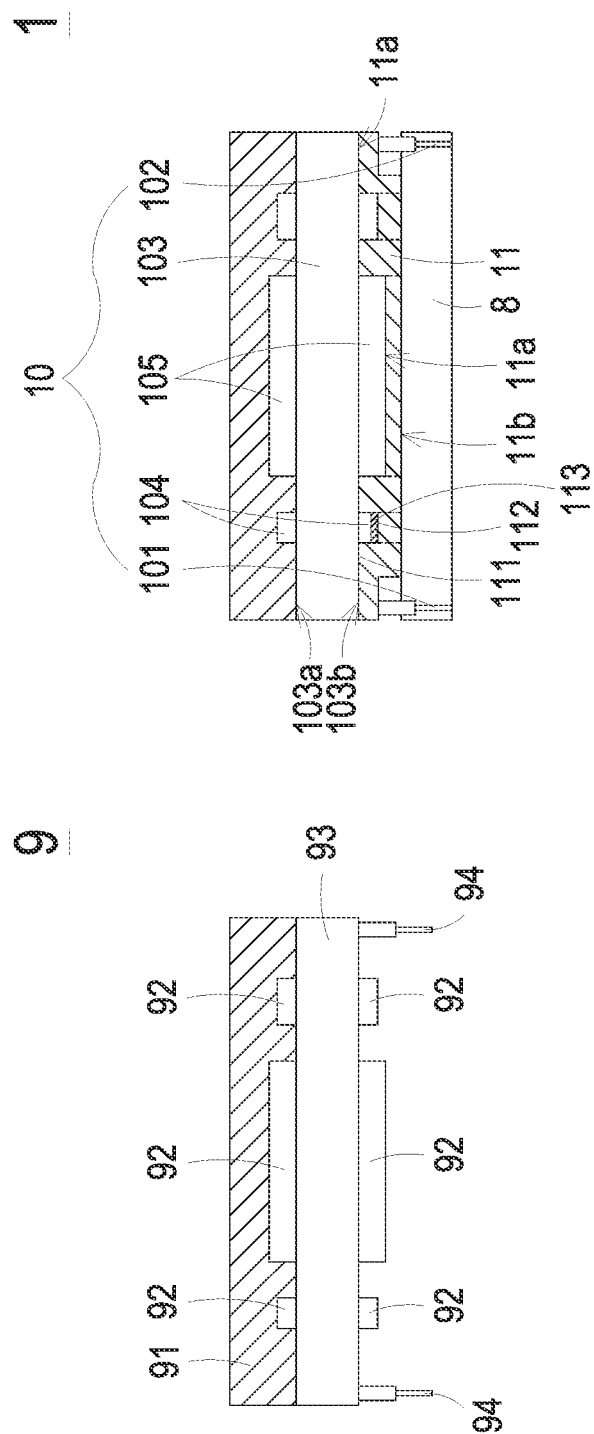

POWER MODULE HAVING METALLIC HEAT-DISSIPATION SUBSTRATE

CROSS-REFERENCE TO RELATED APPLICATION

This application is a continuation application of U.S. application Ser. No. 16/589,874 filed on Oct. 1, 2019, which claims priority from China Patent Application No. 201811206831.9 filed on Oct. 17, 2018. Each of the aforementioned patent applications is incorporated herein by reference for all purposes.

FIELD OF THE INVENTION

The present invention relates to a power module, and more particularly to a power module having a metallic heat-dissipation substrate.

BACKGROUND OF THE INVENTION

On-board high-power DC-DC power modules are widely used in telephone communications, data centers, and supercomputers. With the rapid development of fixed networks and mobile communications, the requirements for output power and efficiency of on-board high-power DC-DC power modules are increasing. In addition, the increasingly miniaturized communication products inevitably require the power module to increase the efficiency while reducing the volume to increase the power density. Therefore, the heat-dissipation problem of the on-board high-power DC-DC power module becomes more serious.

To solve the heat-dissipation problem of the on-board high-power DC-DC power module, a heatsink is commonly installed on the top portion of the power module, and the heat of the heat-generating component placed on the printed circuit board is conducted through the heatsink to reduce the overall temperature and component temperature of the power module.

Please refer to FIG. 1. FIG. 1 schematically illustrates the front view of a conventional on-board high-power DC-DC power module. As shown in FIG. 1, in the conventional on-board high-power DC-DC power module 9, the heat-dissipating substrate 91 is shown by the top hatching. However, because of the high-power density requirement, the heat-generating components 92 of the power module have been placed not only on the first surface of the printed circuit board 93, but also on the second surface of the printed circuit board 93. There is usually a gap existed between the bottom portion of the power module and the system board, so that the heat of the heat-generating component 92 can only be conducted to the pin 94, which is connected with the system board, or the solder point through the printed circuit board 93, and then be heat-dissipated through the system board. The efficiency of heat-dissipation is poor.

Therefore, there is a need of providing an improved power module having a metallic heat-dissipation substrate in order to solve the above drawbacks.

SUMMARY OF THE INVENTION

Some embodiments of the present invention are to provide a power module having a metallic heat-dissipation substrate in order to overcome at least one of the above-mentioned drawbacks encountered by the prior art.

The present invention provides a power module having a first metallic heat-dissipation substrate. By connecting the fixing position of the first surface of the first metallic heat-dissipation substrate with the second surface of the printed circuit board and filling the gap between the heat-dissipating position of the first surface of the first metallic heat-dissipation substrate and the heat-generating component with the gap-filling material, the heat resistance is reduced, the heat-dissipation area and the heat conduct path are increased, and the heat-dissipation efficiency is enhanced.

In accordance with an aspect of the present invention, there is provided a power module. The power module includes a power source module and a first metallic heat-dissipation substrate. The power source module has an input pin and an output pin and includes at least one heat-generating component, a printed circuit board, a magnetic component, and at least one printed circuit board coil. The input pin and the output pin of the power source module are soldered on and electrically connected with a system board. The printed circuit board of the power source module has a first surface and a second surface. The heat-generating component is disposed on the second surface of the printed circuit board. The first metallic heat-dissipation substrate has a first surface and a second surface opposite to each other, and an opening. The first surface of the first metallic heat-dissipation substrate has at least one fixing position and at least one heat-dissipating position. The fixing position of the first surface of the first metallic heat-dissipation substrate is connected with the second surface of the printed circuit board. The magnetic component of the power source module is disposed in the opening of the first metallic heat-dissipation substrate, and one surface of the magnetic component is exposed at the opening. A gap accumulated by tolerances is formed between the heat-dissipating position and the heat-generating component. A gap-filling material is filled into the gap. The second surface of the first metallic heat-dissipation substrate and the system board are soldered with each other.

The above contents of the present invention will become more readily apparent to those ordinarily skilled in the art after reviewing the following detailed description and accompanying drawings, in which:

BRIEF DESCRIPTION OF THE DRAWINGS

FIG. 1 schematically illustrates the front view of a conventional on-board high-power DC-DC power module;

FIG. 2 schematically illustrates the front view of a power module according to an embodiment of the present invention;

DETAILED DESCRIPTION OF THE PREFERRED EMBODIMENT

Figure 3:
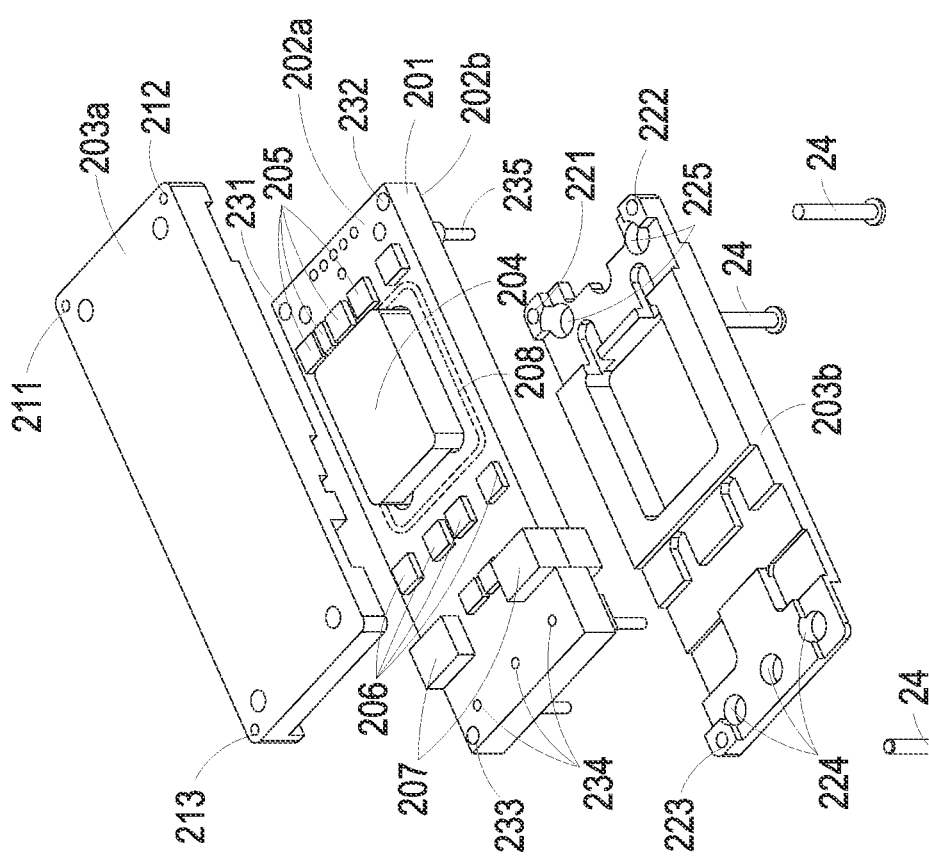
FIG. 3 schematically illustrates the exploded view of a power module according to an embodiment of the present invention.

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Please refer to FIG. 2. FIG. 2 schematically illustrates the front view of a power module according to an embodiment of the present invention. As shown in FIG. 2, a power module 1 is provided by the present invention. Compared with the conventional power module, a first metallic heat-dissipation substrate is additionally installed on the bottom of the power module. The first metallic heat-dissipation substrate 11 is for example but not limited to an aluminum substrate or a copper substrate. In specific, the power module 1 includes a power source module 10 and the first metallic heat-dissipation substrate 11. The power source module 10 has an input pin 101, an output pin 102, and a printed circuit board 103. The input pin 101 and the output pin 102 are extended from a second surface 103b of the printed circuit board 103 and soldered on a system board 8 and electrically connected with the system board 8. The printed circuit board 103 has a first surface 103a and the second surface 103b. At least one heat-generating component 104 is disposed on the second surface 103b. The first metallic heat-dissipation substrate 11 has a first surface 11a and a second surface 11b opposite to each other. The first surface 11a has at least one fixing position 111 and at least one heat-dissipating position 112. The fixing position 111 is directly connected with the second surface 103b or indirectly connected with the second surface 103b through a medium material. A gap 113 accumulated by tolerances is formed between the heat-dissipating position 112 and the heat-generating component 104. A gap-filling material is filled into the gap 113. The second surface 11b and the system board 8 are soldered with each other.

In specific, a solder zone on the second surface 11b of the first metallic heat-dissipation substrate 11 and the system board 8 is treated with a tin plating treatment, an immersion gold treatment or an organic solderability preservative treatment. The heat-generating component 104 can be a switch component of the power source module 10. In addition, the power source module 10 may further include a magnetic component 105 and at least one printed circuit board coil. The printed circuit board coil can be directly printed on the printed circuit board 103, and thus it is not redundantly described herein. The magnetic component 105 includes a first magnetic core and a second magnetic core. With the first magnetic core and the second magnetic core, the planar windings on the printed circuit board are magnetically coupled to form a transformer required by the power source module 10. Certainly, the magnetic component 105 is also a heat-generating component. In some embodiments, the heat-generating component may also be an inductance including the magnetic component and the printed circuit board coil, but not limited thereto.

Please refer to FIG. 3. FIG. 3 schematically illustrates the exploded view of a power module according to an embodiment of the present invention. As shown in FIG. 3, a printed circuit board 201 of a power module 2 has a first surface 202a and a second surface 202b. The plane of the second surface 202b of the printed circuit board 201 is defined as the horizontal plane herein. A transformer 204, a transformer secondary switch set 205, a transformer primary switch set 206 and another heat-generating component 207 are disposed on the first surface 202a of the printed circuit board 201. The heat-generating component 207 may be an inductance, or a metallic heat-dissipation block. Some components may also be disposed on the first surface 202a of the printed circuit board 201 and are not going to be redundantly described herein. The heat-generating components disposed on the first surface 202a of the printed circuit board 201 may be similar with or different from the heat-generating components disposed on the second surface 202b of the printed circuit board 201. In some embodiments, the present invention is described based on that the heat-generating components disposed on the first surface 202a of the printed circuit board 201 are similar with the heat-generating components disposed on the second surface 202b of the printed circuit board 201.

Please refer to FIG. 3 again. The numeral symbol 203a indicates the second metallic heat-dissipation substrate disposed on the top of the power source module. The numeral symbol 203b indicates the first metallic heat-dissipation substrate disposed on the bottom of the power source module. Input pins 234 and output pins 235 of the power source module are respectively penetrated through a first penetration hole set 224 and a second penetration hole set 225 on the first metallic heat-dissipation substrate 203b, and then soldered to the system board through pin soldering, such that the electrical connection and fixing are implemented. In another embodiment, the input pins 234 and the output pins 235 are soldered to the system board through a soldering tablet on the second surface of the first metallic heat-dissipation substrate 203b with a surface mount technology (SMT) to implement the electrical connection and fixing. In addition, the second metallic heat-dissipation substrate 203a is disposed on the first surface 202a of the printed circuit board 201 for installing a heatsink, and the second metallic heat-dissipation substrate 203a and the first metallic heat-dissipation substrate 203b are commonly fixed with a same screw rod 24.

The second metallic heat-dissipation substrate 203a, the printed circuit board 201 and the first metallic heat-dissipation substrate 203b are fixed with screw rods 24 through a penetration hole set I (i.e. a set of a third penetration hole 211, a second penetration hole 221, and a first penetration hole 231), a penetration hole set II (i.e. a set of a third penetration hole 212, a second penetration hole 222, and a first penetration hole 232) and a penetration hole set III (i.e. a set of a third penetration hole 213, a second penetration hole 223, and a first penetration hole 233) in manners of three-point-fixing. None of a gap accumulated by tolerances is formed between the fixing position of the first surface of the first metallic heat-dissipation substrate 203b and the power source module, or the gap accumulated by tolerances approaches 0. In three fixing positions, the number of the fixing points fixing the second metallic heat-dissipation substrate 203a, the printed circuit board 201 and the first metallic heat-dissipation substrate 203b with screw rods 24 are not limited herein. The manners of two-point-fixing and four-point-fixing may be applied. The fixing manner may also be fixing the second metallic heat-dissipation substrate 203a with the printed circuit board 201, fixing the printed circuit board 201 with the first metallic heat-dissipation substrate 203b, or the like to fix the three boards by combining two boards and two boards.

In some embodiments, the fixing manner of fixing through the penetration hole set I, the penetration hole set II, and the penetration hole set III of the second metallic heat-dissipation substrate 203a, the printed circuit board 201, and the first metallic heat-dissipation substrate 203b can be replaced by a soldering tablet. By distributing the positions of the soldering tablet correspondingly to the second metallic heat-dissipation substrate 203a, the printed circuit board 201 and the first metallic heat-dissipation substrate 203b, the three boards may be soldered together with the soldering tablet. In addition, the second metallic heat-dissipation substrate 203a, the printed circuit board 201 and the first metallic heat-dissipation substrate 203b may be fixed together with fixing glue. The method of solder-fixing and fixing with fixing glue have no special requirements on the number of fixing positions, and choices of the fixing positions are diverse, which is more advantageous for reducing the size of the power source module. In the two embodiments, at least one fixing position is fixed at the positions of the magnetic component and the printed circuit board coil 208. Since the occupied area of the printed circuit board coil 208 is relatively larger, the partial area may be utilized again as a fixing position. Meanwhile, the printed circuit board coil 208 is a heat-generating component, so that putting a fixing position nearby brings the advantages of heat-dissipating of the printed circuit board coil 208. Moreover, the fixing position between the first metallic heat-dissipation substrate 203b and the power source module may be connected and fixed through a solderable copper block. A face of the solderable copper block is soldered with the power source module, and the opposite face is soldered with the first metallic heat-dissipation substrate 203b, so that the design difficulty and manufacturing difficulty of the heat-dissipation substrate are reduced.

Figure 4A:
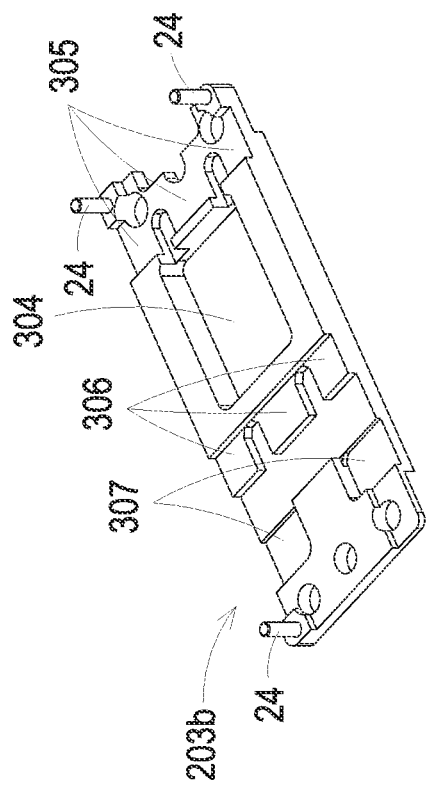
FIG. 4A schematically illustrates the structure of the first metallic heat-dissipation substrate shown in FIG. 3.
Figure 4B:
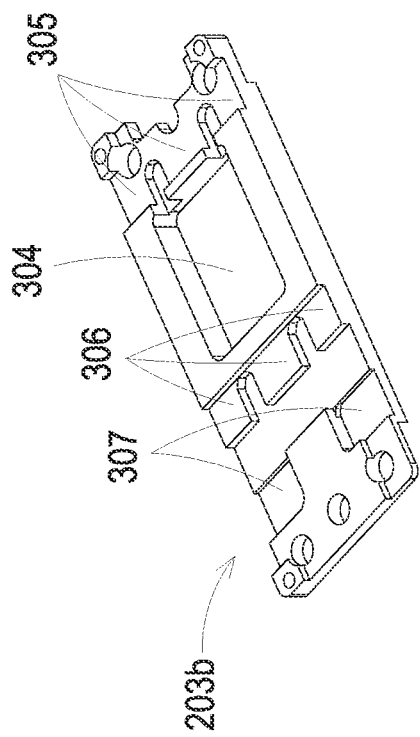
FIG. 4B schematically illustrates the screw rod shown in FIG. 3 penetrating through the first metallic heat-dissipation substrate.

Please refer to FIG. 3, FIG. 4A and FIG. 4B. FIG. 4A schematically illustrates the structure of the first metallic heat-dissipation substrate shown in FIG. 3. FIG. 4B schematically illustrates the screw rod shown in FIG. 3 penetrating through the first metallic heat-dissipation substrate. As shown in FIGS. 3, 4A and 4B, the screw rod 24 can be penetrated through the second penetration hole 221, the second penetration hole 222 and the second penetration hole 223 of the first metallic heat-dissipation substrate 203b, but not limited thereto. Since the heights of the heat-dissipating components put on the second surface 202b of the printed circuit board 201 are different, the thicknesses of the first metallic heat-dissipation substrate have to be correspondingly different, so that the contact face is divided into a plurality of regions. A first region 304 and a surface of the second magnetic core of the transformer 204 are adhered through thermal conductive glue. A surface of the transformer secondary switch set 205 and the second region 305 are adhered through thermal conductive glue. A surface of the transformer primary switch set 206 and the third region 306 are adhered through thermal conductive glue. A surface of another heat-generating component 207 may also be contacted with the fourth region 307 through thermal conductive glue. The main heat-generating components put on the second surface 202b of the printed circuit board 201 are adhered with the first metallic heat-dissipation substrate 203b through thermal conductive glue. The thermal conductive glue (i.e., the gap-filling material) is soft glue, and the thermal conductivity of the gap-filling material is greater than or equal to 0.3 Watts per meter-Kelvin (>0.3 W/mK). In the progress of pressing the power source module and the first metallic heat-dissipation substrate 203b together, the gap-filling material may deform in a specific way, so that the air gaps between the first metallic heat-dissipation substrate 203b and each heat-generating component may be full-filled and the first metallic heat-dissipation substrate 203b may be fully contacted with every heat-generating component. Since the thermal conductivity of the gap-filling material (or the thermal conductive soft glue) is far greater than the thermal conductivity of the air, heat is allowed to pass through the thermal conductive glue and the first metallic heat dissipation substrate in the vertical direction of the defined horizontal plane. The formula of heat resistance is written by:

$$R_{th} = 1(kA),$$

wherein 1 is the substrate thickness of the region the heat-generating component and the first metallic heat-dissipation substrate are adhered at, k is the thermal conductivity of the material selected according to the first metallic heat-dissipation substrate, and A is the planar area of the first metallic heat-dissipation substrate on the direction of the horizontal plane.

It can be easily seen that since the conductive path 1 is small and the conductive area A is large, the heat resistance of the present invention is significantly reduced, and the heat-dissipation efficiency is significantly enhanced. In addition, the thermal conductive glue (i.e. the gap-filling material) may further reduce the tolerance of the power source module, hence the manufacturing process is simplified.

In this embodiment, the region division and distribution of the first metallic heat-dissipation substrate 203b are not limited herein. The position and the area of the region located, and the thickness of the first metallic heat-dissipation substrate 203b corresponding to the region should be decided according to the practical size and position of the main heat-dissipating component of the power source module. In another embodiment, the first region 304 is hollowed out to expose the core face of the transformer 204. The hollowing process can reduce the thickness of the first metallic heat-dissipation substrate 203b, thereby reducing the total thickness of the power module 2. In other words, the first metallic heat-dissipation substrate 203b has an opening 2030 in the center, and a face of the magnetic component is exposed at the opening 2030.

It is only described in this embodiment by taking the first metallic heat-dissipation substrate 203b for example to illustrate the design of the first surface. The design of the second metallic heat-dissipation substrate 203a is similar with this, so it is not redundantly described herein. In this embodiment, the second metallic heat-dissipation substrate and the first metallic heat-dissipation substrate can be made of copper, aluminum, or another thermal conductive solid material.

Figure 5:
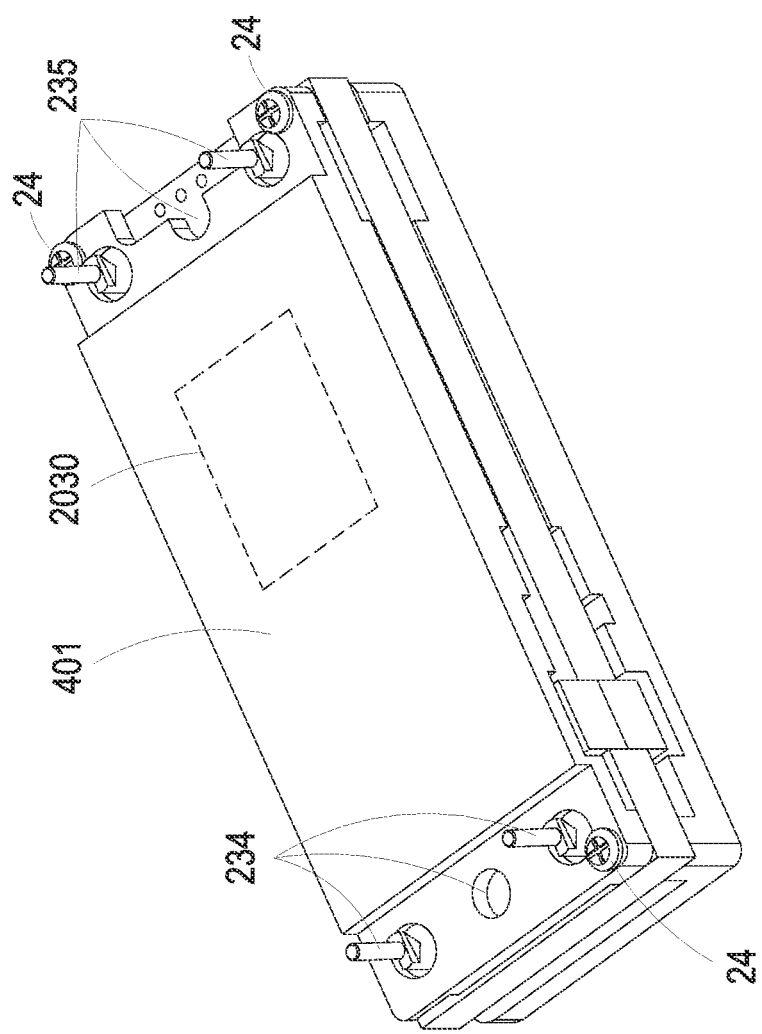
FIG. 5 schematically illustrates the structure of a power module with a second surface of the first metallic heat-dissipation substrate being above according to an embodiment of the present invention.

Please refer to FIG. 3 and FIG. 5. FIG. 5 schematically illustrates the structure of a power module with a second surface of the first metallic heat-dissipation substrate being above according to an embodiment of the present invention. As shown in FIG. 3 and FIG. 5, the second surface of the first metallic heat-dissipation substrate 203b is a flat surface, and the second surface and the system board are soldered through reflow soldering. In some embodiments, the region 401 of the second surface of the first metallic heat-dissipation substrate 203b is parallel with the defined horizontal plane. The region 401 can be directly soldered to the system board through a large-area copper foil, so that a rapid heat-dissipation can be implemented by the power module 2 through the large-area copper foil. The large-area copper foil can be a negative input voltage Vin− of the power source module or a negative output voltage Vo− of the power source module. Meanwhile, when the electrical connection between the system board and the power module 2 is implemented through the input pins 234 and the output pins 235, the heat of the main heat-generating component of the power source module may be transferred to the first metallic heat-dissipation substrate 203b, and then rapidly and effectively transferred to the system board through the soldering of the region 401 and the input pins 234 and the output pins 235.

Figure 6:
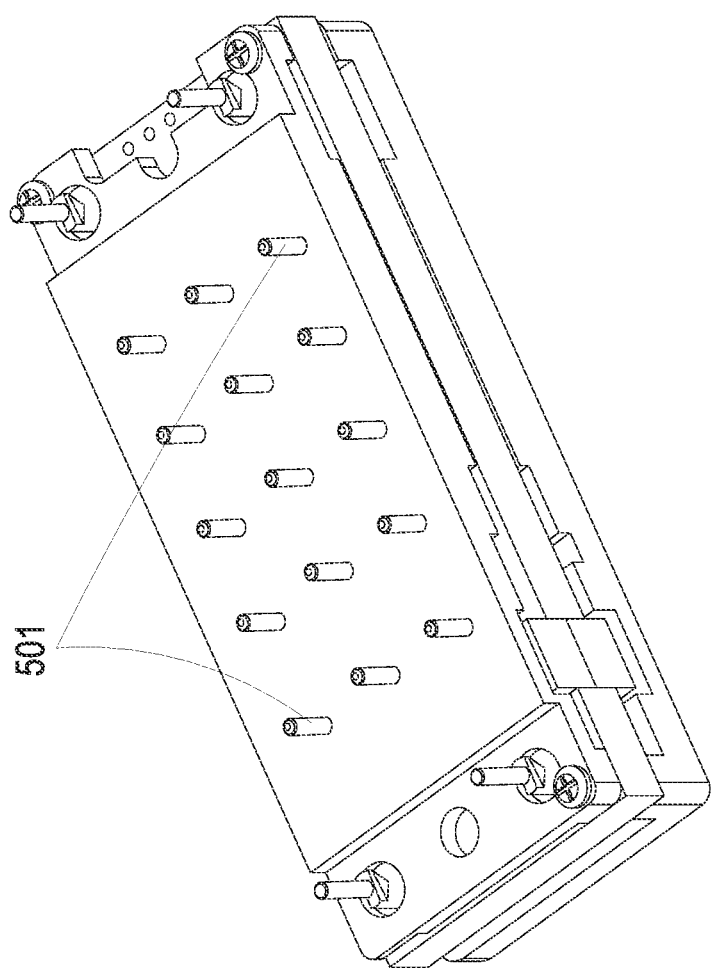
FIG. 6 schematically illustrates the structure of a power module with a second surface of the first metallic heat-dissipation substrate having a plurality of pins and being above according to an embodiment of the present invention.

In some embodiments, the second surface of the first metallic heat-dissipation substrate may be implemented with a plurality of pins. Please refer to FIG. 3 and FIG. 6. FIG. 6 schematically illustrates the structure of a power module with a second surface of the first metallic heat-dissipation substrate having a plurality of pins and being above according to an embodiment of the present invention. As shown in FIG. 3 and FIG. 6, a specific number of pin set 501 is pressure-averagely distributed over the second surface of the first metallic-heat dissipation substrate 203b, and the pin set 501 includes a plurality of pins protruded downwardly (protruded upwardly in FIG. 6). The system board has a plurality of penetration holes in the corresponding locations, by inserting the pins into the penetration holes of the system board and soldering the pins with the system board, the heat may be rapidly transferred to the system board through the pin set 501 to implement heat-dissipation through the system board. In some embodiments, the number and the shape of the pin set 501 are not limited. The design of the pin set 501 can be adjusted and varied according to the layout of the system board, the area of the first metallic heat-dissipation substrate 203b and the loss of the power source module.

From the above discussion, the present invention provides a power module having a first metallic heat-dissipation substrate. By connecting the fixing position of the first surface of the first metallic heat-dissipation substrate with the second surface of the printed circuit board and filling the gap between the heat-dissipating position of the first surface of the first metallic heat-dissipation substrate and the heat-generating component with the gap-filling material, the heat resistance is reduced, the heat-dissipation area is increased, and the heat-dissipation efficiency is enhanced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A power module comprising:
a power source module having an input pin and an output pin and comprising at least one heat-generating component, a printed circuit board, a magnetic component, and at least one printed circuit board coil, wherein the input pin and the output pin of the power source module are soldered on and electrically connected with a system board, the printed circuit board of the power source module has a first surface and a second surface, and the at least one heat-generating component is disposed on the second surface of the printed circuit board; and
a first metallic heat-dissipation substrate having a first surface and a second surface opposite to each other, and an opening, wherein the first surface of the first metallic heat-dissipation substrate has at least one fixing position and at least one heat-dissipating position, the fixing position of the first surface of the first metallic heat-dissipation substrate is connected with the second surface of the printed circuit board, the magnetic component of the power source module is disposed in the opening of the first metallic heat-dissipation substrate, one surface of the magnetic component is exposed at the opening, a gap accumulated by tolerances is formed between the heat-dissipating position and the heat-generating component, a gap-filling material is filled into the gap, and the second surface of the first metallic heat-dissipation substrate and the system board are soldered with each other.

2. The power module according to claim 1, wherein the heat-generating component of the power source module is a switch component, a transformer, or an inductance.

3. The power module according to claim 1, wherein the fixing position of the first surface of the first metallic heat-dissipation substrate is connected with the second surface of the printed circuit board of the power source module through a medium material.

4. The power module according to claim 1, wherein the second surface of the printed circuit board of the power source module is soldered with the fixing position of the first surface of the first metallic heat-dissipation substrate.

5. The power module according to claim 1, wherein the thermal conductivity of the gap-filling material is greater than or equal to 0.3 Watts per meter-Kelvin (W/mK).

6. The power module according to claim 1, wherein the first metallic heat-dissipation substrate is an aluminum substrate or a copper substrate.

7. The power module according to claim 1, wherein the second surface of the first metallic heat-dissipation substrate is a flat surface.

8. The power module according to claim 1, wherein the power module further comprises a plurality of pins disposed on the second surface of the first metallic heat-dissipation substrate, and the pins are inserted into the system board and soldered with the system board.

9. The power module according to claim 1 further comprising a second metallic heat-dissipation substrate, wherein the second metallic heat-dissipation substrate is disposed on the first surface of the printed circuit board of the power source module, and the second metallic heat-dissipation substrate and the first metallic heat-dissipation substrate are commonly fixed with a screw rod.

10. The power module according to claim 1, wherein the input pin and the output pin of the power source module are extended from the second surface of the printed circuit board of the power source module.

11. The power module according to claim 1, wherein the power source module is a power converter.

12. The power module according to claim 1, wherein the printed circuit board of the power source module has a first penetration hole, and the first metallic heat-dissipation substrate has a second penetration hole.

13. The power module according to claim 12, wherein the first penetration hole of the printed circuit board and the second penetration hole of the first metallic heat-dissipation substrate are aligned to form a penetration hole set.

14. The power module according to claim 13, wherein the penetration hole set is penetrated by a screw rod to fasten the printed circuit board and the first metallic heat-dissipation substrate.

15. The power module according to claim 12 further comprising a second metallic heat-dissipation substrate, wherein the second metallic heat-dissipation substrate is disposed on the first surface of the printed circuit board of the power source module, and wherein the second metallic heat-dissipation substrate has a third penetration hole.

16. The power module according to claim 15, wherein the first penetration hole of the printed circuit board, the second penetration hole of the first metallic heat-dissipation substrate, and the third penetration hole of the second metallic heat-dissipation substrate are aligned to form a penetration hole set, and the penetration hole set is penetrated by a screw rod to fasten the printed circuit board, the first metallic heat-dissipation substrate, and the second metallic heat-dissipation substrate.

* * * * *